United States Patent
Ito

(10) Patent No.: US 9,478,445 B2
(45) Date of Patent: Oct. 25, 2016

(54) SUBSTRATE LIQUID PROCESSING APPARATUS AND METHOD FOR DETECTING ABNORMALITY OF AIR FLOW

(71) Applicant: Tokyo Electron Limited, Tokyo (JP)

(72) Inventor: Norihiro Ito, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 106 days.

(21) Appl. No.: 14/200,668

(22) Filed: Mar. 7, 2014

(65) Prior Publication Data

US 2014/0261172 A1    Sep. 18, 2014

(30) Foreign Application Priority Data

Mar. 12, 2013  (JP) .................... 2013-048919

(51) Int. Cl.
*B05C 11/10*   (2006.01)
*H01L 21/67*   (2006.01)
*H01L 21/30*   (2006.01)

(52) U.S. Cl.
CPC ......... *H01L 21/67051* (2013.01); *H01L 21/30* (2013.01); *H01L 21/67178* (2013.01); *H01L 21/67253* (2013.01); *B05C 11/1039* (2013.01)

(58) Field of Classification Search
CPC .............. B05C 11/1039; H01L 21/30; H01L 21/67051; H01L 21/67178; G03F 7/162
USPC ............ 118/663, 712, 52, 56, 319, 320, 50; 73/37
See application file for complete search history.

(56) References Cited

U.S. PATENT DOCUMENTS

| | | | | |
|---|---|---|---|---|
| 5,254,367 A | * | 10/1993 | Matsumura | B05D 1/005 427/240 |
| 7,322,225 B2 | * | 1/2008 | Gerbi | H01L 21/67253 702/51 |
| 7,694,650 B2 | * | 4/2010 | Huang | H01L 21/67253 118/319 |
| 2004/0118676 A1 | * | 6/2004 | Mizohata | C25D 21/12 204/193 |

FOREIGN PATENT DOCUMENTS

| | | |
|---|---|---|
| JP | 09-148231 A | 6/1997 |
| JP | 2006-332085 A | 12/2006 |
| JP | 2009-059795 A | 3/2009 |

* cited by examiner

*Primary Examiner* — Laura Edwards
(74) *Attorney, Agent, or Firm* — Abelman, Frayne & Schwab

(57) ABSTRACT

A substrate liquid processing apparatus includes a substrate holding unit configured to hold and rotate a substrate; a processing liquid nozzle configured to supply a processing liquid to the substrate; a cylindrical liquid receiving cup configured to receive and recover the processing liquid scattered from the substrate; a housing configured to accommodate the substrate holding unit and the liquid receiving cup; a cup exhaust path connected to the liquid receiving cup to exhaust atmosphere inside the liquid receiving cup; a cup exhaust path pressure sensor configured to detect pressure in the cup exhaust path; a housing pressure sensor configured to detect pressure in the housing outside the liquid receiving cup; and a control unit configured to alert when a difference between a value detected by the housing pressure sensor and a value detected by the cup exhaust path pressure sensor is a predetermined determination reference value or less.

3 Claims, 2 Drawing Sheets

SUBSTRATE LIQUID PROCESSING APPARATUS AND METHOD FOR DETECTING ABNORMALITY OF AIR FLOW

CROSS-REFERENCE TO RELATED APPLICATIONS

This application is based on and claims priority from Japanese Patent Application No. 2013-048919, filed on Mar. 12, 2013 with the Japan Patent Office, the disclosure of which is incorporated herein in its entirety by reference.

TECHNICAL FIELD

The present disclosure relates to a method for detecting an abnormality of an air flow that flows in a liquid receiving cup in a substrate liquid processing apparatus.

BACKGROUND

A process for manufacturing semiconductor devices includes performing a predetermined liquid processing by supplying a processing liquid such as a chemical liquid to a substrate such as a semiconductor wafer. Such a liquid processing is performed, for example, by a substrate liquid processing apparatus including a spin chuck configured to hold the substrate in a horizontal posture and rotate the substrate around a vertical axis, a processing liquid nozzle configured to supply the processing liquid to the substrate held by the spin chuck, and a liquid receiving cup configured to receive and recover the processing liquid scattered outwardly from the substrate by a centrifugal force. The liquid receiving cup is provided with an exhaust port, and the exhaust port is connected to an exhaust duct of a factory exhaust system. Since the inside of the exhaust duct is at negative pressure, the internal atmosphere of the liquid receiving cup is exhausted through the exhaust port, and thus, the inside of the liquid receiving cup comes to negative pressure. Meanwhile, since a clean gas flows into the housing, in which the spin chuck and the liquid receiving cup are stored, to form a down flow, the inside of the housing comes to positive pressure with respect to the liquid receiving cup. By forming such a pressure gradient, the atmosphere in a space above the substrate held by the spin chuck (clean gas atmosphere) flows into the liquid receiving cup and is exhausted from the exhaust port of the liquid receiving cup to the factory exhaust system. Since the mist-like processing liquid entrained in the air flow and scattered from the substrate flows smoothly inside the liquid receiving cup towards the exhaust port, re-adhesion of the mist to the substrate is prevented or suppressed.

However, if the pressure relationship is lost for any reason, the air flow accompanied with mist may flow backward to the upper space of the wafer from the inside of the liquid receiving cup. The mist contaminates the surface of the substrate, and adversely affects process results. Accordingly, in order to prevent the contaminated wafer from proceeding in the next process, or in order to take measures of the backward flow, an operation must be able to determine that it is a situation in which backward flow may occur.

Japanese Patent Laid-Open Publication No. 2009-059795 discloses an air flow control technique in which pressure inside a liquid receiving cup is detected by an internal pressure sensor, pressure outside the liquid receiving cup (i.e., pressure in a housing) is detected by an external pressure sensor, and an air flow control device (specifically, a height position of a spin chuck of an air flow control drum with respect to a base) is feedback-controlled such that a value detected by the external pressure sensor is not less than a value detected by the internal pressure sensor. That is, in this case, the pressure gradient is adjusted appropriately by an adjustment mechanism.

In a multi-stage liquid receiving cup having a plurality of cup bodies, different exhaust flow paths are used depending on the kind of the processing liquid supplied to the substrate. Therefore, it is necessary to provide a pressure sensor in each of the exhaust flow paths. However, since the cup bodies constituting the multi-stage liquid receiving cup move for switching the exhaust flow paths, it is difficult to attach the sensor to each of the exhaust flow paths, or a sensor attachment structure becomes complicated.

SUMMARY

The present disclosure provides a substrate liquid processing apparatus including: a substrate holding unit configured to hold and rotate a substrate; a processing liquid nozzle configured to supply a processing liquid to the substrate held by the substrate holding unit; a cylindrical liquid receiving cup having a top opening and configured to enclose a periphery of the substrate held by the substrate holding unit so as to receive and recover the processing liquid scattered from the substrate; a housing configured to accommodate the substrate holding unit and the liquid receiving cup; a cup exhaust path connected to the liquid receiving cup to exhaust atmosphere inside the liquid receiving cup; a cup exhaust path pressure sensor configured to detect pressure in the cup exhaust path; a housing pressure sensor configured to detect pressure in the housing outside the liquid receiving cup; and a control unit configured to alert when a difference between a value detected by the housing pressure sensor and a value detected by the cup exhaust path pressure sensor is a predetermined determination reference value or less.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
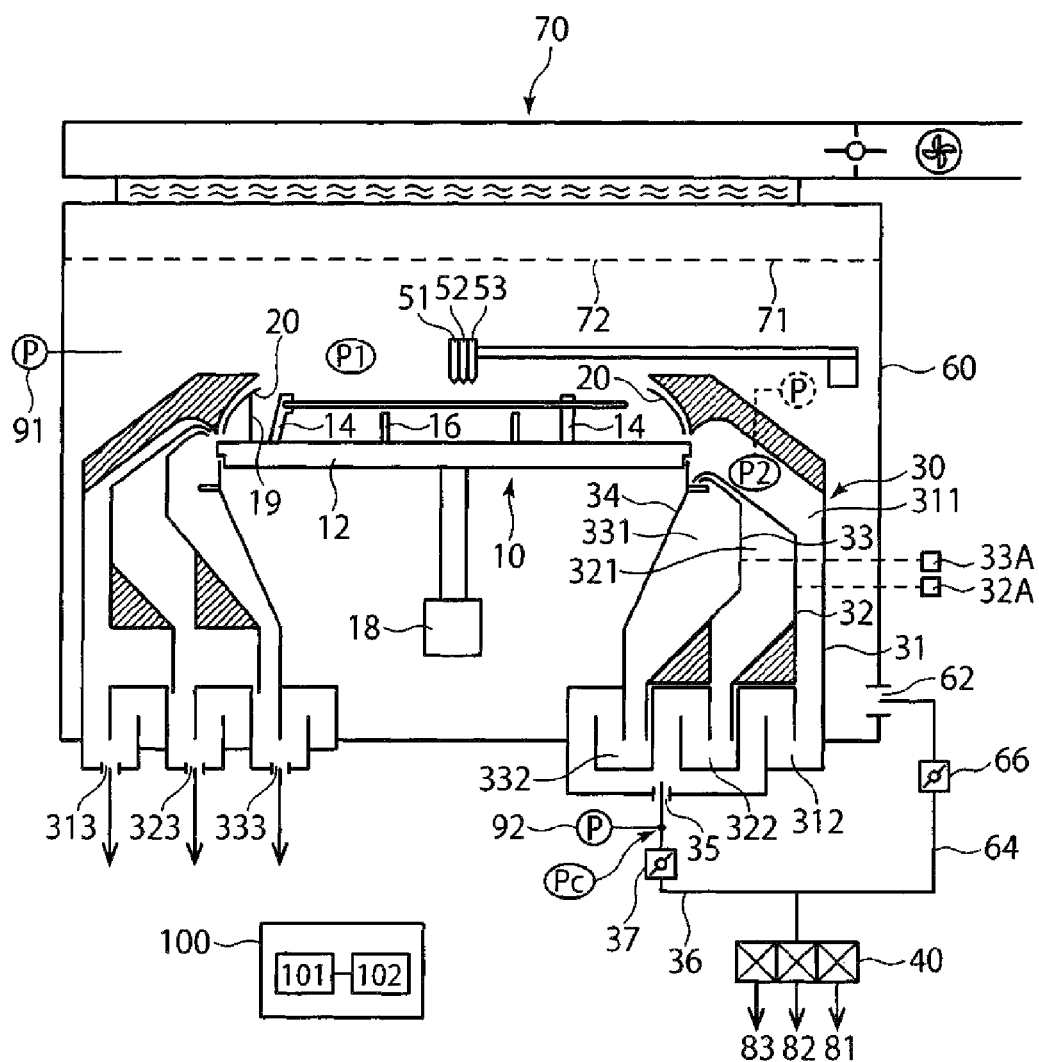
FIG. 1 is a schematic view illustrating a configuration of an exemplary embodiment of a substrate liquid processing apparatus according to the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure provides a technique of detecting whether an abnormality occurs in an air flow that flows into a liquid receiving cup from a top opening of the liquid receiving cup and flows down the liquid receiving cup to be discharged to a cup exhaust path.

According to an exemplary embodiment, the present disclosure provides substrate liquid processing apparatus including: a substrate holding unit configured to hold and rotate a substrate; a processing liquid nozzle configured to supply a processing liquid to the substrate held by the substrate holding unit; a cylindrical liquid receiving cup having a top opening and configured to enclose a periphery of the substrate held by the substrate holding unit so as to receive and recover the processing liquid scattered from the substrate; a housing configured to accommodate the substrate holding unit and the liquid receiving cup; a cup exhaust path connected to the liquid receiving cup to exhaust atmosphere inside the liquid receiving cup; a cup exhaust path pressure sensor configured to detect pressure in the cup exhaust path; a housing pressure sensor configured to detect pressure in the housing outside the liquid receiving cup; and a control unit configured to alert when a difference between a value detected by the housing pressure sensor and a value detected by the cup exhaust path pressure sensor is a predetermined determination reference value or less.

In the above-described substrate liquid processing apparatus, when the pressure in the housing is P1, the pressure in the liquid receiving cup is P2, and the pressure in the cup exhaust path is Pc, the predetermined determination reference value is a value obtained by adding a predetermined margin to the value of Pc when a magnitude relationship between P1 and P2 is reversed.

According to another exemplary embodiment, the present disclosure provides a method of detecting, by using a substrate liquid processing apparatus including a substrate holding unit configured to hold and rotate a substrate, a processing liquid nozzle configured to supply a processing liquid to the substrate held by the substrate holding unit, a cylindrical liquid receiving cup having a top opening and configured to enclose a periphery of the substrate held by the holding unit so as to receive and recover the processing liquid scattered from the substrate, a housing configured to accommodate the substrate holding unit and the liquid receiving cup, and a cup exhaust path connected to the liquid receiving cup to exhaust atmosphere inside the liquid receiving cup, whether an abnormality occurs in an air flow that flows into the liquid receiving cup from the top opening of the liquid receiving cup and flows down the liquid receiving cup to be discharged to the cup exhaust path when processing the substrate by supplying the processing liquid to the substrate while the substrate is being rotated and the liquid receiving cup is being exhausted. The method includes detecting, by a cup exhaust path pressure sensor, pressure in the cup exhaust path; detecting, by a housing pressure sensor, pressure in the housing outside the liquid receiving cup, and issuing an alert when a difference between a value detected by the housing pressure sensor and a value detected by the cup exhaust path pressure sensor is a predetermined determination reference value or less.

In the above-described method, when the pressure in the housing is P1, the pressure in the liquid receiving cup is P2, and the pressure in the cup exhaust path is Pc, the predetermined determination reference value is a value obtained by adding a predetermined margin to the value of Pc when a magnitude relationship between P1 and P2 is reversed.

According to the present disclosure, the air flow in the liquid receiving cup may be accurately determined based on the detection value of the pressure system installed in the housing and the cup exhaust path, thereby enhancing production management efficiency.

Hereinafter, an exemplary embodiment of the present disclosure will be described with reference to the accompanying drawings. As illustrated in FIG. 1, the substrate liquid processing apparatus includes a substrate holding unit 10 configured to hold a semiconductor wafer (hereinafter, simply referred to as a "wafer") W in a horizontal posture. The substrate holding unit 10 is formed as a mechanical spin chuck having a disc-shaped base 12 and a plurality of (e.g., three) chuck claws 14 attached to the base 12. The base 12 is provided with a plate (not illustrated) having lift pins 16 configured to support and lift the bottom of the wafer when performing a delivery of the wafer W in relation to an external transportation arm. The substrate holding unit 10 can be rotated by a rotation driving unit 18 having an electric motor. Thus, the wafer W held by the substrate holding unit 10 can be rotated around a vertical axis.

An annular rotary cup 20 is attached to the base 12 of the substrate holding unit 10 through three (only one illustrated) pillars 19. The inner peripheral surface of the rotary cup 20 receives a processing liquid spun off and scattered from the wafer W after being supplied to the wafer W which is rotating, and guides the received processing liquid to a liquid receiving cup 30.

The liquid receiving cup 30 has a plurality of cups 31 to 33, and at least one (two in this example) of them is operated for flow path switching. Specifically, the liquid receiving cup 30 includes a first immovable annular cup 31 positioned at the outermost side, that is, an outside cup, a second elevatable annular cup 32 positioned inside the first cup 31, a third elevatable annular cup 33 positioned inside the second cup 32, and an immovable inner wall 34 positioned inside the third cup 33. The second cup 32 and the third cup 33 are moved up and down by elevation mechanisms 32A, 33A, respectively, as schematically illustrated in FIG. 1. The second cup 32 and the third cup 33 at a moved-up position are illustrated in the left side of FIG. 1, and the second cup 32 and the third cup 33 at a moved-down position are illustrated in the right side of FIG. 1. The first to third cups 31 to 33 and the inner wall 34 are not rotated. A first flow path 311 is formed between the first cup 31 and the second cup 32, a second flow path 321 is formed between the second cup 32 and the third cup 33, and a third flow path 331 is formed between the third cup 33 and the inner wall 34.

The bottom of the cup 30 is formed with a cup exhaust port 35 in communication with the first flow path 311, the second flow path 321 and the third flow path 331. A cup exhaust path 36 is connected to the cup exhaust port 35. An opening adjustable valve such as, for example, a butterfly valve 37 is interposed in the cup exhaust path 36. By adjusting the degree of opening of the butterfly valve 37, it is possible to adjust the exhaust flow rate from the cup 30 through the cup exhaust path 36.

A curved portion is provided in the middle of each of the first flow path 311, the second flow path 321 and the third flow path 331, and a liquid component is separated from a gas-liquid mixed fluid flowing through each flow path by being turned sharply in the curved portion. The separated liquid component is dropped into a liquid receiver 312 corresponding to the first flow path 311, a liquid receiver 322 corresponding to the second flow path 321 and a liquid receiver 332 corresponding to the first flow path 331. The liquid receivers 312, 322, 332 are connected to an acidic liquid effluent system, an alkaline liquid effluent system, or a general liquid effluent system (all not illustrated) through the corresponding drain ports 313, 323, 333, respectively.

In addition, the substrate liquid processing apparatus is provided with a plurality of processing liquid nozzles configured to eject (supply) processing liquids towards the wafer W that is held and rotated in the substrate holding unit 10. In this example, there are installed an acidic chemical liquid nozzle 51 configured to eject an acidic cleaning liquid (e.g., diluted hydrofluoric acid (DHF)), an alkaline chemical liquid nozzle 52 configured to eject an alkaline cleaning liquid (e.g., SC-1), and a rinse liquid nozzle 53 configured to eject a rinse liquid (e.g., deionized water (DIW)). The nozzles are respectively supplied with the processing liquids from a processing liquid supply mechanism (not illustrated) provided with a processing liquid supply path connected to a processing liquid supply source in which a flow adjuster, such as an opening/closing valve or a flow adjusting valve, is interposed in the processing liquid supply path.

The substrate holding unit 10 and the cup 30 are accommodated in the housing 60. On the ceiling of the housing 60, a fan filter unit (FFU) 70 is installed. Below the ceiling of the housing 60, a rectifying plate 71 formed with a plurality of through-holes 72 is installed. The rectifying plate 71 rectifies a clean air (CA) ejected downwardly from the FFU 70 so as to evenly flow on the wafer W. In the housing 60, a downflow of the clean air flowing downwardly from the through-holes 72 of the rectifying plate 71 towards the wafer W is always formed.

In the lower portion of the housing 60 (specifically, a position lower than at least the top opening of the cup 30) and outside the cup 30, a housing exhaust port 62 is installed to exhaust the atmosphere in the housing 60. A housing exhaust path 64 is connected to the housing exhaust port 62. An opening adjustable valve such as, for example, a butterfly valve 66 is interposed in the housing exhaust path 64.

When a switching valve 40 is in a first switching state, the cup exhaust path 36 and the housing exhaust path 64 are connected to an acidic atmosphere exhaust line 81, which is a part of a factory exhaust system. When the switching valve 40 is in a second switching state, the cup exhaust path 36 and the housing exhaust path 64 are connected to an alkaline atmosphere exhaust line 82. In addition, when the switching valve 40 is in a third switching state, the exhaust path 36 and the housing exhaust path 64 are connected to a general atmosphere exhaust line 83. Since each of the exhaust lines 81 to 83 is at negative pressure, the internal space of the cup 30 and the internal space of the housing 60 are evacuated depending on the switching state of the switching valve 40.

The substrate liquid processing apparatus is provided with a housing pressure system 91 configured to detect a pressure P1 in the housing 60, and a cup exhaust path pressure system 92 configured to detect a pressure Pc at an upstream position of the butterfly valve 37 of the cup exhaust path 36.

As schematically illustrated in FIG. 1, the substrate liquid processing apparatus includes a controller (control unit) 100 configured to integrally control the entire operations thereof. The controller 100 controls operations of all functional components (e.g., the rotation driving unit 18, the elevation mechanisms for the second and third cups 32, 33, the processing liquid supply mechanism (not illustrated), the switching valve 40, the FFU 70, a gas supply mechanism (not illustrated), etc.) of the substrate liquid processing apparatus. The controller 100 may be implemented using, for example, a general purpose computer as hardware and a program (an apparatus control program and a processing recipe) to operate the computer as software. The software may be stored in a storage medium such as, for example, a hard disc drive which is fixedly provided in the computer, or in a storage medium such as, for example, a CD-ROM, a DVD, and a flash memory which are removably set in the computer. The storage media are indicated by a reference numeral 101 in FIG. 1. A processor 102 calls and executes a predetermined processing recipe from a storage medium 101 based on, for example, instructions from a user interface (not illustrated) as needed, and as a result, each functional component of the substrate liquid processing apparatus is operated under the control of the controller 100 to perform a predetermined processing.

Next, descriptions will be made on the operation of the substrate liquid processing apparatus performed under the control of the controller 100.

[Acidic Chemical Liquid Cleaning Processing]

The wafer W is held by the substrate holding unit 10 and rotated by the rotation driving unit 18. An acidic chemical liquid, for example, DHF, is supplied to the rotating wafer W from the acidic chemical liquid nozzle 51 such that an acidic chemical liquid cleaning processing is performed on the wafer W. The acidic chemical liquid is spun off from the wafer W by a centrifugal force, and received in the rotary cup 20. At this time, the second cup 32 and the third cup 33 are positioned at the moved-down position (the position as illustrated in the right side of FIG. 1), and the acidic chemical liquid flows through the first flow path 311 between the first cup 31 and the second cup 32.

At this time, the clean air supplied from the FFU 70 to be present in the space above the wafer W flows into the cup 30 through a gap between the inner periphery of the rotary cup 20 and the outer periphery of the wafer W. After flowing into the cup 30, the clean air flows through the first flow path 311. Then, the clean air is exhausted from the cup exhaust port 35 and flows to the acidic atmosphere exhaust line 81 through the cup exhaust path 36 and the switching valve 40 which is in the first switching state.

Further, a part of the acidic chemical liquid is in a mist state due to collision with the wafer, or collision with the rotary cup 20, the first cup 31 and the like. The mist flows into the cup 30 is, and flows towards the cup exhaust port 35 by being entrained in the air flow flowing through the first flow path 311. Most of the mist is captured by a wall of the curved portion installed in the middle of the first flow path 311, and dropped into the liquid receiver 312. In addition, the acidic chemical liquid, which flows down along the surfaces of the first cup 31 and the second cup 32 that adjoin the first flow path 311, is dropped into the liquid receiver 312. The acidic chemical liquid dropped into the liquid receiver 312 is discharged from the cup 30 through a drain port 313.

Further, the gas present in the space around the cup 30 in the internal space of the housing 60 is exhausted from the housing exhaust port 62, and flows to the acidic atmosphere exhaust line 81 through the housing exhaust path 64 and the switching valve 40 which is in the first switching state.

[First Rinse Processing]

Next, while continuing the rotation of the wafer W, the ejection of the acidic chemical liquid from the acidic chemical liquid nozzle 51 is stopped. Instead, a rinse liquid, for example, DIW, is supplied as a processing liquid to the wafer W from the rinse liquid nozzle 53. By doing this, the acidic chemical liquid and residue remaining on the wafer W are washed out. The discharge path of the gas, the processing liquid and the like in the first rinse processing is the same as in the acidic chemical liquid cleaning processing.

[Alkaline Chemical Liquid Cleaning Processing]

Next, while continuing the rotation of the wafer W, the ejection of the rinse liquid from the rinse liquid nozzle 53 is stopped. The switching valve 40 is made to be in the second switching state by moving the second cup 32 to the moved-up position while maintaining the third cup 33 at the moved-down position. Subsequently, an alkaline cleaning liquid, for example, SC-1, is supplied as a processing liquid to the wafer W from the alkaline chemical liquid nozzle 52 such that an alkaline chemical liquid cleaning processing is performed on the wafer W.

In this alkaline chemical liquid cleaning processing, the gas (clean air) present in the space above the wafer W flows into the cup 30 through the top opening of the first cup 31. Then, the gas flows through the second flow path 321 between the second cup 32 and the third cup 33 to be exhausted from the cup exhaust port 35, and flows to the alkaline atmosphere exhaust line 82 through the cup exhaust path 36 and the switching valve 40. The chemical liquid scattered from the wafer W flows through the second flow path 321, is dropped into the liquid receiver 322, and then, is discharged from the cup 30 through a drain port 323. The gas present in the space around the cup 30 in the internal space of the housing 60 is exhausted from the housing exhaust port 62, and flows to the alkaline atmosphere exhaust line 82 through the housing exhaust path 64 and the switching valve 40.

[Second Rinse Processing]

Next, while continuing the rotation of the wafer W, the ejection of the alkaline chemical liquid from the alkaline chemical liquid nozzle 52 is stopped. Instead, a rinse liquid is supplied to the wafer W from the rinse liquid nozzle 53. By doing this, the alkaline chemical liquid and residue remaining on the wafer W are washed out. The discharge path of the gas, the processing liquid and the like in the second rinse processing is the same as in the alkaline chemical liquid cleaning processing.

[Dry Processing]

Next, while continuing the rotation of the wafer W, the ejection of the rinse liquid from the rinse liquid nozzle 53 is stopped. The valve body of the switching valve 40 is made to be in the third switching state by moving the third cup 33 to the moved-up position while maintaining the second cup 32 at the moved-up position (as illustrated in the left side of FIG. 1). The rotation of the wafer W continues for a predetermined period of time in this state. By doing this, the DIW remaining on the wafer W is spun off from the wafer W such that a dry processing of the wafer W is performed. When the dry processing is performed, the clean gas flowing into the cup 30 from the upper space of the wafer W flows down through the third flow path 331 between the third cup 33 and the inner wall 34 to be exhausted from the cup exhaust port 35, and flows to the general atmosphere exhaust line 83 through the cup exhaust path 36 and the switching valve 40. After flowing through the third flow path 331, the chemical liquid scattered from the wafer W is dropped into the liquid receiver 332 and discharged from the cup 30 through the drain port 333. The gas present in the space around the cup 30 in the internal space of the housing 60 is exhausted from the housing exhaust port 62, and flows to the general atmosphere exhaust line 83 through the housing exhaust path 64 and the switching valve 40. During the dry processing, it is not necessary to perform the exhaust through the housing exhaust path 64.

Next, description will be made in detail on flow of the fluid related to the cup 30 when performing the acidic chemical liquid processing. Further, when performing the acidic chemical liquid processing, the second cup 32 and the third cup 33 are at the moved-down position, as illustrated in the right side of FIG. 1. Further, the internal space of the housing 60 is exhausted through the housing exhaust path 64 at a predetermined flow rate. Further, when the exhaust flow rate through the housing exhaust path 64 is constant, that is, unless the exhaust flow rate through the housing exhaust path 64 is actively varied by adjusting the degree of opening of the butterfly valve 66, the exhaust through the housing exhaust path 64 does not affect phenomena to be described below (pressure variation and backward flow). Thus, the exhaust through the housing exhaust path 64 will not be mentioned in the following description.

Now, it is assumed that the wafer is not rotated. Inside the housing 60, a downflow of the clean air flowing downwardly from FFU 70 towards the upper surface of the wafer is always formed. The atmosphere in the cup 30 (particularly, the atmosphere in the first flow path 311) is exhausted through the cup exhaust path 36 at a predetermined flow rate. By appropriately setting the supply flow rate of the clean air from the FFU 70 and the exhaust flow rate through the housing exhaust path 64, the relationship of the pressure P1 in the housing 60 (the detection value of the housing pressure system 91), the pressure P2 in the first flow path 311, and the pressure Pc in the cup exhaust path 36 (the detection value of the cup exhaust pressure system) is established as "P1>P2>Pc". In addition, the downflow of the clean air from the FFU 70 flows smoothly into the cup 30, flows smoothly towards the cup exhaust port 35 through the first flow path 311, and flows out from the cup exhaust port 35 to the cup exhaust path 36.

When the wafer W is rotated from this state, the gas around the front and rear surfaces of the wafer W is dragged and moved by the rotation of the wafer W to form a swirling flow which travels outwardly in the radial direction of the wafer W in a spiral form. Further, a swirl flow which travels outwardly in the radial direction of the wafer W in a spiral form is also formed in the vicinity of the base 12 of the substrate holding unit 10 and the rotary cup 20. These swirling flows facilitate the draw of the downflow of the clean air from the FFU 70 to the inside of the cup 30, and push the drawn clean air to the first flow path 311 in the cup 30. Due to the influence, the pressure P1 in the housing 60 decreases, and the pressure P2 in the cup 30 and the pressure Pc in the cup exhaust path 36 increase. The increase and decrease in pressure become higher as the rotation speed of the wafer becomes higher. Even if the rotation speed of the wafer is increased to some extent, the air flow flows smoothly as described above as long as the relationship "P1>P2>Pc" is maintained. Thus, the mist of the acidic chemical liquid also flows towards the cup exhaust port 35 by being entrained in the air flow.

However, if the rotation speed of the wafer W is further increased to be "P2≥P1", an abnormality occurs in the air flow. Specifically, the gas above the wafer W cannot enter into the first flow path 311. In addition, once entering into the first flow path 311, the gas flows backward to the space above the wafer through a gap between the wafer W and the rotary cup 20 and a gap between the rotary cup 20 and the first cup 31. The mist of the chemical liquid flows backward to the space above the wafer W by being entrained in the flow of the gas that flows backward, and attached to the wafer W. Such adhesion of the mist of the chemical liquid may cause generation of particles. Accordingly, the relationship of "P1>P2" must be maintained. At least, an operator must be able to determine whether an event called "P2≥P1" occurs.

The pressure P1 may be detected by the housing pressure system 91, and the housing pressure system 91 may be easily installed as well. However, in a case of a cup including movable cup bodies (the second and third cups 32, 33) as illustrated, it is difficult to incorporate a pressure system into the cup (the first to third flow paths 311, 321, 331). Further, since the chemical liquid is scattered to the first flow path 311 and the second flow path 321, the above case is not desirable as an installation environment for the pressure system. Further, since a relatively high dynamic pressure derived from the swirling flow is generated in the first to third flow paths 311, 321, 333, it is difficult to measure pressure accurately. Further, the inside of the first flow path 311 and the second flow path 321 to which the chemical liquid is scattered is not desirable as an installation environment for the pressure system having a function of correcting dynamic pressure.

Accordingly, in the present exemplary embodiment, whether a situation that causes an abnormality of the air flow occurs, particularly, whether a situation that generates a backward flow of the air flow (that is, a backward flow of the mist) may occur is determined based on the correlation between the pressure P1 in the housing 60 detected by the housing pressure system 91 and the pressure Pc in the cup exhaust flow path 36 detected by the cup exhaust flow path pressure system 92.

Figure 2:
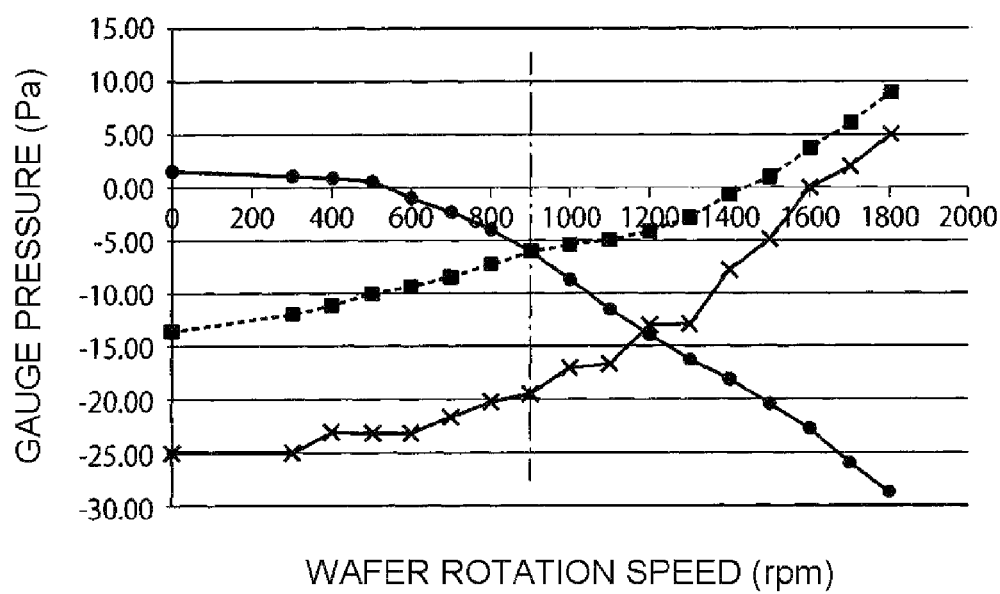
FIG. 2 is a graph illustrating changes in pressure in a housing and pressure in a cup exhaust path in accordance with a change in a wafer rotation speed for every exhaust flow rate by the cup exhaust path.

The graph of FIG. 2 illustrates changes of the pressure P1 (indicated as ●), the pressure P2 (indicated as ■) and the pressure Pc (indicated as x) in accordance with the change in the rotation speed of the wafer, when a washing test operation was actually performed with the substrate liquid processing apparatus, and each of the exhaust flow rates through the cup exhaust path 36 was set to 0.5 m$^3$/min. Further, in the test, the pressure P2 was measured with the pressure system by forming a through-hole on the ceiling portion of the first cup 31 of the liquid receiving cup 30, and inserting the test pressure system into the first flow path 311 (indicated by a broken line in the right side of FIG. 1). In the graph, the vertical line indicated by a dashed line corresponds to a wafer rotation speed (about 900 rpm in the present example) where "P1=P2", that is, a wafer rotation speed where an abnormality may occur in the air flow to generate a backward flow. From the graph, it may be seen that, at least around the wafer rotation speed where "P1=P2", as the wafer rotation speed increases, the pressure P1 in the housing 60 decreases, and the pressure P2 in the first flow path 311 and the pressure Pc in the cup exhaust path 36 increase. That is, it may be seen that there may be a correlation between the pressure Pc in the cup exhaust path 36 and the pressure P2 in the first flow path 311, and the relationship between the pressure P1 in the housing 60 and the pressure P2 in the first flow path 311 may be estimated with some certainty based on the relationship between the pressure P1 in the housing 60 and the pressure Pc in the cup exhaust path 36. Accordingly, it is possible to determine whether it is in a state where the backward flow occurs with a certain probability, based on a determination reference value obtained by setting a certain margin (e.g., 3 Pa) with respect to the value "P1−Pc" (about 13 Pa in the present example) at the wafer rotation speed where "P1=P2". Specifically, here, the determination reference value may be, for example, P1−Pc>16 Pa. Of course, since the determination reference value varies depending on the size of the apparatus, it may be needed to determine the determination reference value according to a test using an apparatus having the same configuration as the actual apparatus.

In the storage medium 101 of the controller (control unit) 100, the determination reference value of a difference in pressure (P1−Pc) which is determined by the test for every exhaust flow rate by the cup exhaust path 36 is compared with the actual difference in pressure based on the detection values of the housing pressure system 91 and the cup exhaust path pressure system 92. In a case where the difference in pressure (P1−Pc) is smaller than the determination reference value, an alert is issued to an operator by displaying the alert on the user interface such as a display (not illustrated) or generating an alarm sound or alarm light. The operator who receives the alert takes out the corresponding wafer W, performs a particle checking of the wafer W with a particle inspection apparatus, and in response to the inspection result, takes a suitable action such as sending the wafer W to the next process or discarding the wafer W.

As described above, according to the present exemplary embodiment, the backward flow possibility may be accurately determined based on the detection value of the pressure system installed in the housing 60 and the cup exhaust path 36 which may be relatively easily installed. Accordingly, production management efficiency may be improved.

Further, the determination of the backward flow possibility according to the measurement of the difference in pressure (P1−Pc) and the comparison with the determination reference value is not limited to the acidic chemical liquid processing, but may also be performed in the alkaline chemical liquid processing, the rinse processing, and the dry processing. It is desirable that the determination reference value is determined for every processing. Since the determination of the backward flow possibility may be performed using the same pressure systems 91, 92, an increase in apparatus cost may be suppressed.

Further, in each of the exemplary embodiments, the substrate liquid processing apparatus includes the rotary cup (rotary cup body) 20 and a non-rotary cup 30 (constituted with a plurality of cup bodies 31 to 33) as a liquid receiving cup configured to receive the processing liquid scattered from the wafer, but is not limited thereto. The liquid receiving cup may be constituted only with non-rotary cup bodies. Further, although the determination of the backward flow possibility based on the difference between the pressure in the housing and the pressure in the cup exhaust path is particularly advantageous in a situation in which it is difficult to dispose the pressure system in the liquid receiving cup (e.g., in a case of including a movable cup body), the determination as described above may also be performed in any other cases. Further, the substrate liquid processing apparatus may be used not only in the cleaning processing, but also in a coating processing and a development processing.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:
1. A substrate liquid processing apparatus comprising:
a substrate holding unit configured to hold and rotate a substrate;
a processing liquid nozzle configured to supply a processing liquid to the substrate held by the substrate holding unit;
a cylindrical liquid receiving cup including a plurality of moveable cups each having a top opening and configured to enclose a periphery of the substrate held by the substrate holding unit so as to receive and recover the processing liquid scattered from the substrate;
a housing configured to accommodate the substrate holding unit and the liquid receiving cup;

a cup exhaust path provided with an opening adjustable valve and connected to a bottom side of the liquid receiving cup to exhaust atmosphere inside the liquid receiving cup;

a cup exhaust path pressure sensor provided at an upstream side of the opening adjustable valve of the cup exhaust path and configured to detect pressure of an air flow of an upstream position of the opening adjustable valve in the cup exhaust path;

a housing pressure sensor configured to detect pressure of an air flow in the housing outside the liquid receiving cup; and a control unit configured to alert when a difference between a value detected by the housing pressure sensor and a value detected by the cup exhaust path pressure sensor is a predetermined determination reference value or less, wherein, when the pressure in the housing detected by the housing pressure sensor is P1, the pressure in the cup exhaust path detected by the cup exhaust path pressure sensor is Pc, and pressure, P2, in the liquid receiving cup is detected by a test pressure system different from the housing pressure sensor and the cup exhaust path pressure sensor, the controller is further configured to determine the predetermined determination reference value by adding a predetermined margin to the pressure Pc in the cup exhaust path detected when the pressure P1 in the housing becomes lower than the pressure P2 in the liquid receiving cup.

2. The substrate liquid processing apparatus of claim 1, wherein the cup exhaust path pressure sensor is commonly configured to detect a pressure of an air flow in each of the plurality of moveable cups.

3. The substrate liquid processing apparatus of claim 1, wherein each of the plurality of moveable cups is configured for a different type of processing including an acidic chemical liquid processing, an alkaline chemical liquid processing, a rinse processing and a dry processing.

* * * * *